United States Patent
Ng et al.

(10) Patent No.: US 12,086,460 B2
(45) Date of Patent: Sep. 10, 2024

(54) NON-DESTRUCTIVE READBACK AND WRITEBACK FOR INTEGRATED CIRCUIT DEVICE

(71) Applicant: Intel Corporation, Santa Clara, CA (US)

(72) Inventors: Bee Yee Ng, Bayan Lepas (MY); Jun Pin Tan, Kuala Lumpur (MY); Yi Peng, Newark, CA (US)

(73) Assignee: Intel Corporation, Santa Clara, CA (US)

( * ) Notice: Subject to any disclaimer, the term of this patent is extended or adjusted under 35 U.S.C. 154(b) by 747 days.

(21) Appl. No.: 17/132,672

(22) Filed: Dec. 23, 2020

(65) Prior Publication Data

US 2021/0149601 A1 May 20, 2021

(51) Int. Cl.
*G06F 3/06* (2006.01)
*G06F 1/06* (2006.01)
*G06F 30/343* (2020.01)

(52) U.S. Cl.
CPC .............. *G06F 3/0659* (2013.01); *G06F 1/06* (2013.01); *G06F 3/0616* (2013.01); *G06F 3/0673* (2013.01); *G06F 30/343* (2020.01)

(58) Field of Classification Search
CPC ........ G06F 3/0659; G06F 1/06; G06F 3/0616; G06F 3/0673
See application file for complete search history.

(56) References Cited

U.S. PATENT DOCUMENTS

| | | | | |
|---|---|---|---|---|
| 5,327,466 A * | 7/1994 | Marinaro | ............... | H04L 7/0338 375/354 |
| 5,359,630 A * | 10/1994 | Wade | ........................ | G06F 1/10 375/362 |
| 6,349,122 B1 * | 2/2002 | Woodman, Jr. | ........ | H04L 7/0337 375/373 |
| 6,542,999 B1 * | 4/2003 | Dreps | ....................... | G06F 5/06 713/400 |

* cited by examiner

*Primary Examiner* — Ajay Ojha
(74) *Attorney, Agent, or Firm* — Fletcher Yoder, P.C.

(57) ABSTRACT

Systems and methods for non-destructive readback and writeback of an integrated circuit system are provided. Such a system may include an adaptive logic element including a first register pair. The first register pair may include a first register operating at a first frequency and a second register operating at a second frequency. The second frequency may be equal to or lower than the first frequency. The second register may store data from the first register. The adaptive logic element may also include a first clock providing a first clock signal to the first register and a second clock providing a second clock signal. The adaptive logic element may also include a multiplexer that may select the first clock signal or the second clock signal as a clock source for the second register.

18 Claims, 10 Drawing Sheets

NON-DESTRUCTIVE READBACK AND WRITEBACK FOR INTEGRATED CIRCUIT DEVICE

BACKGROUND

The present disclosure relates to non-destructive readback and writeback of an integrated circuit system that may be emulated on an integrated circuit device, such as a field programmable gate array (FPGA), application specific integrated circuit (ASIC), and so forth.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices may be utilized for a variety of purposes or applications and programmable logic devices may be utilized to perform these functions. The design of a programmable logic device may be limited by the amount of hardware resources available. For example, an FPGA device may be used to emulate an ASIC device with non-destructive readback and writeback capabilities. One way of doing this involves adding dedicated shadow registers to the FPGA. These dedicated shadow registers, however, may increase power cost and take up significant area on the integrated circuit.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "including" and "having" are intended to be inclusive and mean that there may be additional elements other than the listed elements. Additionally, it should be understood that references to "some embodiments," "embodiments," "one embodiment," or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B.

Programmable logic fabric of an integrated circuit device may be programmed to implement a programmable circuit design to perform a wide range of functions and operations. The programmable logic fabric may include configurable blocks of programmable logic (e.g., sometimes referred to as logic array blocks (LABs) or configurable logic blocks (CLBs)) that have lookup tables (LUTs) that can be configured to operate as different logic elements based on the configuration data programmed into memory cells in the blocks.

Figure 1:
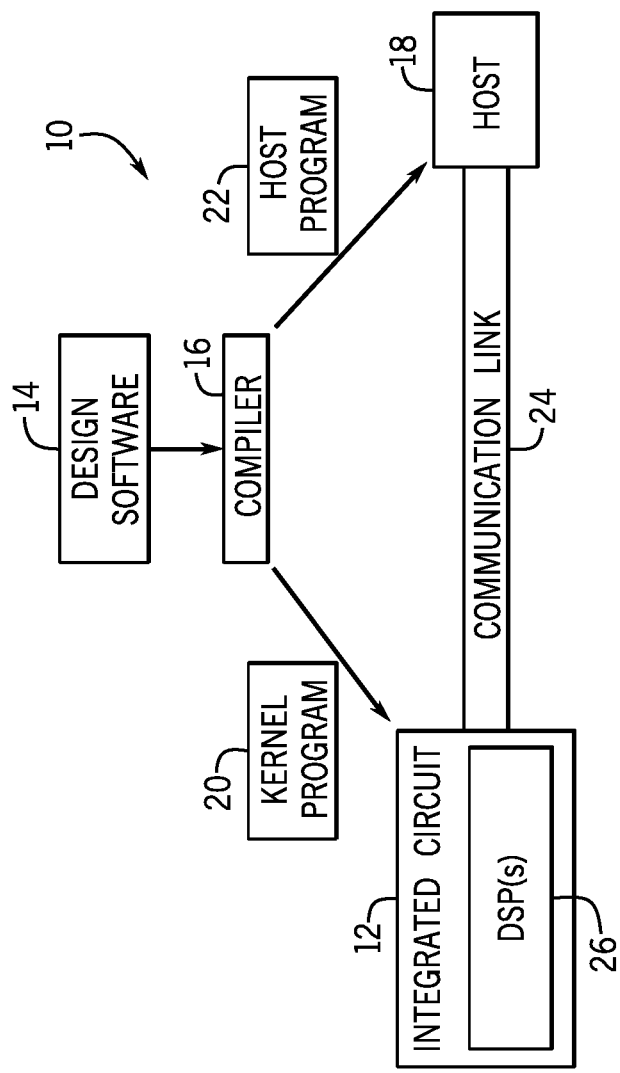
FIG. 1 is a block diagram of a system that may implement arithmetic operations using a DSP block, in accordance with an embodiment of the present disclosure.

As used herein, "ASIC emulation" refers to implementing at least a portion of an application-specific integrated circuit (ASIC) circuit design into another programmable logic device (e.g., an FPGA) in order to validate the functionality of the ASIC circuit design. The present systems and techniques relate to embodiments of systems and methods for non-destructive readback and writeback for programmable logic devices during ASIC emulation. Integrated circuit devices may be utilized for a variety of purposes or applications and programmable logic devices may be utilized to perform these functions. The design of a programmable logic device may be limited by the amount of hardware resources available. For example, an FPGA device may be used to emulate an ASIC device with non-destructive readback and writeback capabilities. Shadow registers store data and dedicated shadow registers may be added to the FPGA which increase power cost and take up significant area. As such, techniques which do not require dedicated shadow registers may increase power savings and available hardware resources on the FPGA With this in mind, FIG. 1 illustrates a block diagram of a system 10 that may implement arithmetic operations using components of an integrated circuit device, such as components of a programmable logic device (e.g., a configurable logic block, an adaptive logic module, a DSP block). A designer may desire to implement functionality, such as the implementation operations of this disclosure, on an integrated circuit device 12 (such as a field-programmable gate array (FPGA), an application-specific integrated circuit (ASIC), a programmable logic array (PLA), and so forth.) In some cases, the designer may specify a high-level program to be implemented, such as an OpenCL program, which may enable the designer to more efficiently and easily provide programming instructions to configure a set of programmable logic cells for the integrated circuit device 12 without specific knowledge of low-level hardware description languages (e.g., Verilog or VHDL). For example, because OpenCL is quite similar to other high-level programming languages, such as C++, designers of programmable logic familiar with such programming languages may have a reduced learning curve by avoiding learning unfamiliar low-level hardware description languages to implement new functionalities in the integrated circuit device 12.

The designers may implement their high-level designs using design software 14, such as a version of Intel® Quartus® by INTEL CORPORATION. The design software 14 may use a compiler 16 to convert the high-level program into a lower-level description. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of one or more DSP blocks 26 on the integrated circuit device 12. The DSP block 26 may include circuitry to implement, for example, operations to perform matrix-matrix or matrix-vector multiplication for AI or non-AI data processing. The integrated circuit device 12 may include many (e.g., hundreds or thousands) of the DSP blocks 26. Additionally, DSP blocks 26 may be communicatively coupled to another such that data outputted from one DSP block 26 may be provided to other DSP blocks 26.

While the techniques described above refer to the application of a high-level program, in some embodiments, the designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
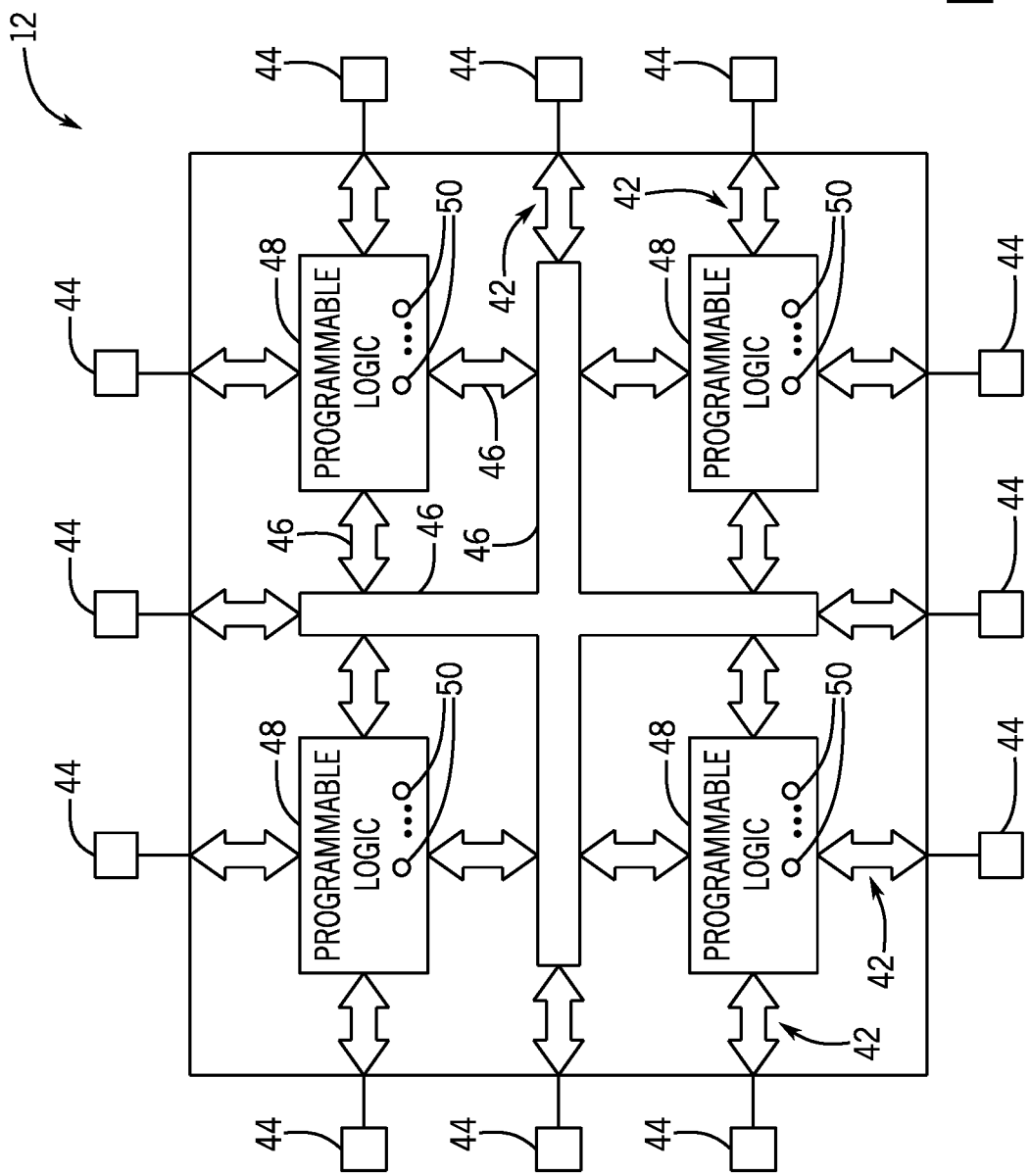
FIG. 2 is a block diagram of the integrated circuit device of FIG. 1, in accordance with an embodiment of the present disclosure.

Turning now to a more detailed discussion of the integrated circuit device 12, FIG. 2 illustrates an example of the integrated circuit device 12 as a programmable logic device, such as a field-programmable gate array (FPGA). Further, it should be understood that the integrated circuit device 12 may be any other suitable type of integrated circuit device (e.g., an application-specific integrated circuit and/or application-specific standard product). As shown, the integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (e.g., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of the programmable logic 48.

Programmable logic devices, such as the integrated circuit device 12, may contain programmable elements 50 within the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
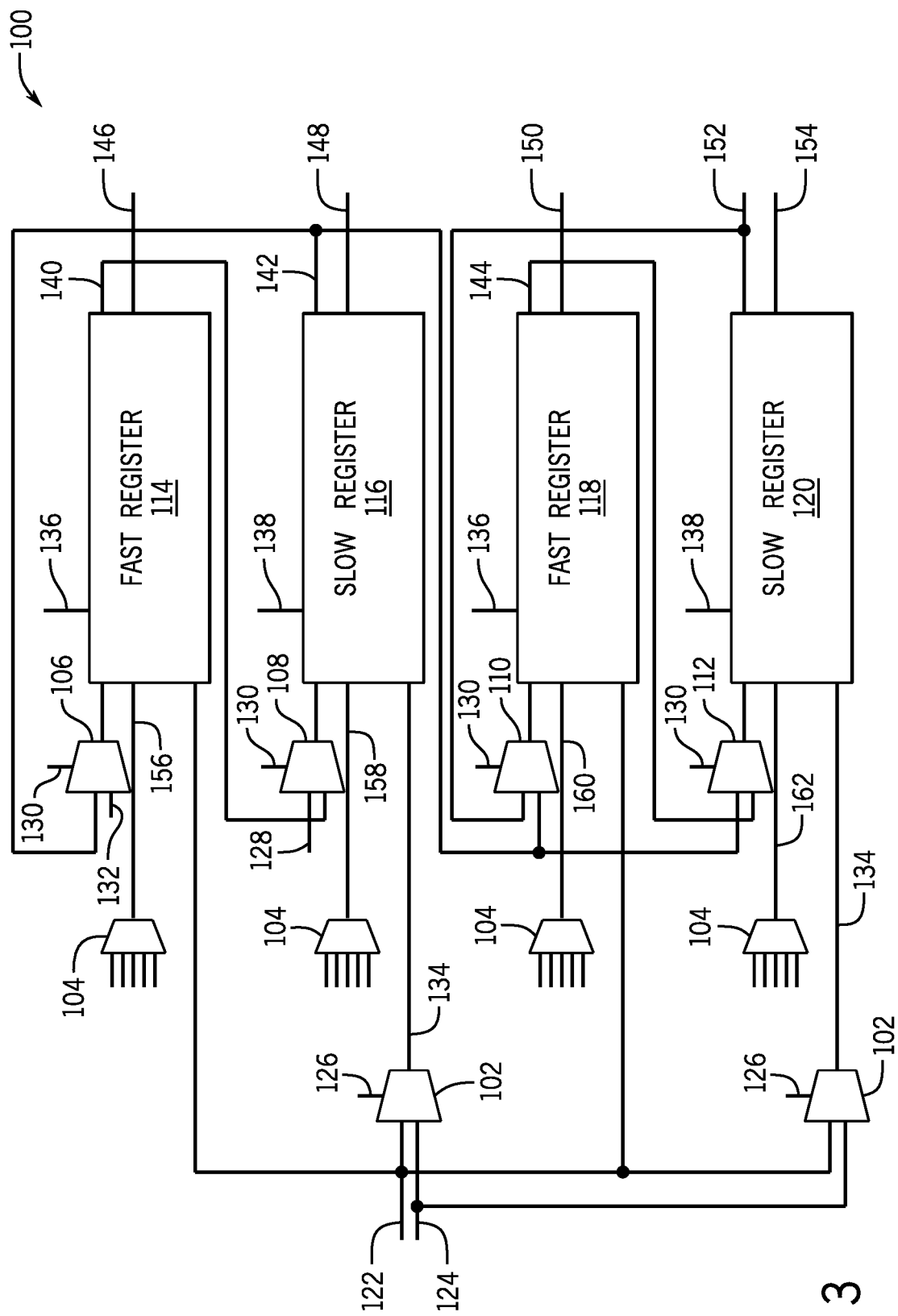
FIG. 3 is a block diagram of an adaptive logic element of the integrated circuit device of FIG. 1, in accordance with an embodiment of the present disclosure.

FIG. 3 is a block diagram of an adaptive logic element 100 of the integrated circuit device 12 of FIG. 1, in accordance with an embodiment of the present disclosure. The adaptive logic element 100 may include any suitable number of registers. As shown, the adaptive logic element 100 includes four user registers 114, 116, 118, and 120. Each register may be a storage unit and may store a single bit of data. Additionally, each register may receive a clock signal that may change the output of the register. In some embodiments, the clock signal may be a low-to-high transition of the clock signal. Registers 114, 116 may form a first register pair and registers 118, 120 may form a second register pair. Each register pair may function as a single register during ASIC emulation. In some embodiments, any suitable number (e.g., three registers, four registers, and so forth) may function as a single register during ASIC emulation. Register 114 and register 118 may be fast registers and registers 116, 120 may be slow registers. As used herein, a "fast register" may be utilized for ASIC device-under-test (DUT) logic during ASIC emulation and a "slow register" may function as a shadow register by providing non-destructive register readback. In some embodiments, the fast registers may support a higher maximum frequency than a maximum frequency of the slow registers. For example, the fast register may operate at a higher frequency than a frequency of the slow register. The slow registers may be formed using circuitry that may take up less die space or may be less expensive than the fast registers. The slow registers are designed using high-VT (e.g., high threshold voltage) transistors for less power leakage, thereby reducing power consumption when compared to the fast registers. Hence, as will be discussed below, using register pairs that use a slow register (e.g., 116) and a fast register (e.g., 114) may efficiently enable non-destructive readback and writeback. However, if desired, the register pairs may be formed from two or more fast registers or two or more slow registers. Indeed, in some examples, the adaptive logic element 100 may include only fast registers or only slow registers. Additionally or alternatively, the slow registers may operate at a frequency equal to or less than a frequency of the fast registers.

The adaptive logic element 100 may include LAB clock signal 122 and design for test (DFT) clock signal 124. Fast registers 114, 118 may receive the LAB clock signal 122 as a clock source. Each slow register, (e.g., slow register 116, 120) may be connected to a corresponding multiplexer 102. In certain embodiments, the multiplexer 102 may receive the LAB clock signal 122 and the DFT clock signal 124 and may select one of the clock signals to provide as clock source for the slow registers 116, 120. Each register of the adaptive logic element 100 may be connected to a multiplexer to provide test data as input, such as multiplexer 106 connected to register 114.

Figure 4:
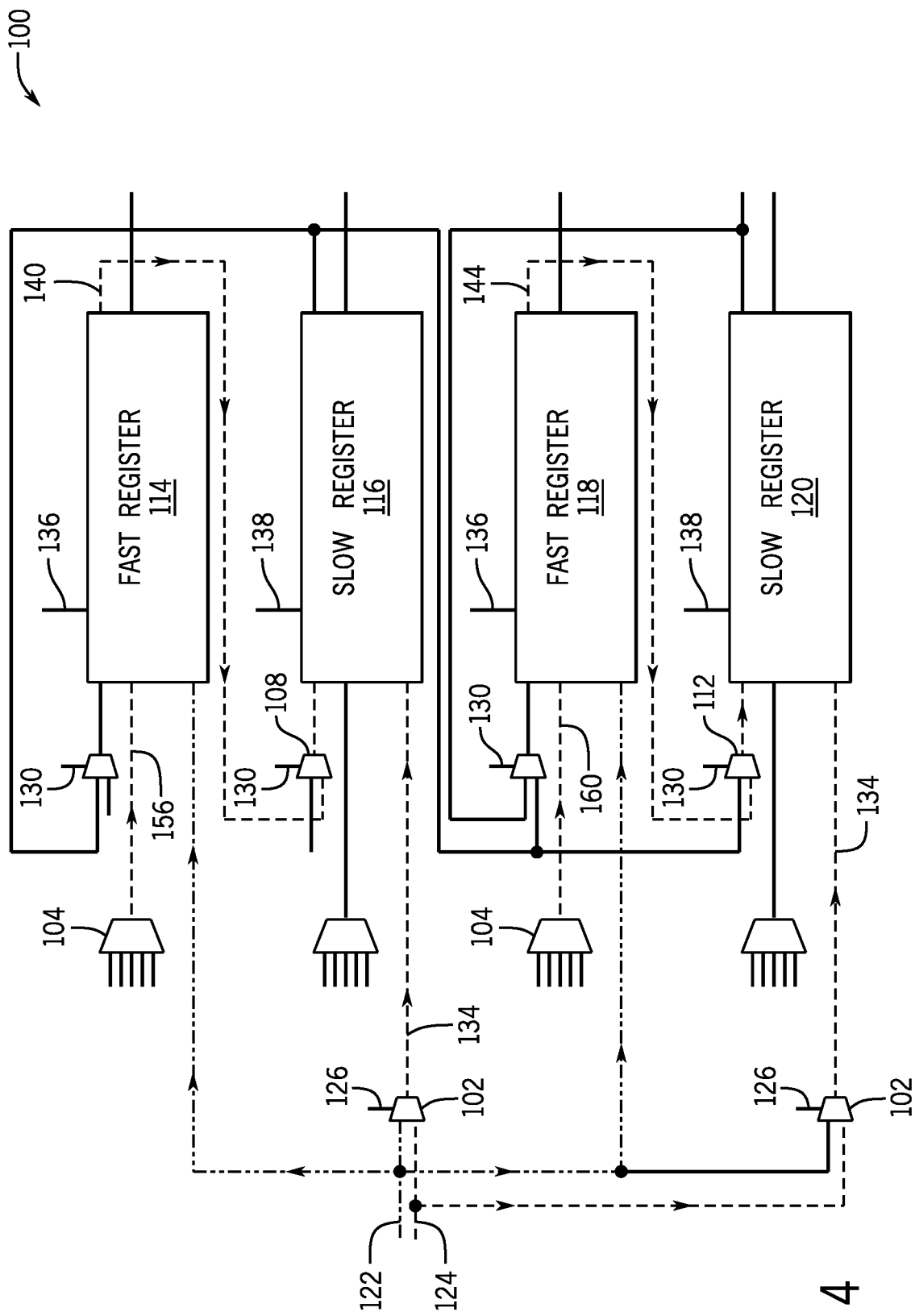
FIG. 4 is a block diagram of the adaptive logic element of FIG. 3 performing a user data sampling operation during emulation readback, in accordance with an embodiment of the present disclosure.

FIG. 4 is a block diagram of the adaptive logic element 100 of FIG. 3 performing a user data sampling operation during emulation readback, in accordance with an embodiment of the present disclosure. During the data sampling operation, data output from the fast registers 114, 118 may be stored in the corresponding slow registers 116, 120. The fast registers 114, 118 may receive the LAB clock signal 122 as a clock source. The fast registers 114, 118 may be connected to multiplexers 104 that receive DFT unload signal 136 and select user data input signals 156, 160, respectively as output from the multiplexers 104. The multiplexers 102 may receive an emulation signal 126 and the emulation signal 126 may instruct the multiplexers 102 to select the DFT clock signal 124 as output 134 received by the slow registers 116, 120. Test data output 140 from the fast register 114 may be received by the multiplexer 108 connected to the slow register 116. The multiplexer 108 may receive DFT load signal 130 and may select the test data output 140 from the fast register 114 as input to the slow register 116. The multiplexer 112 may receive the DFT load signal 130 and may select the test data output 144 from the fast register 118 as input to the slow register 120. As such, the slow register 116 may store the test data output 140 and the slow register 120 may store the test data output 144. The control and clock signals supplied to the registers of the adaptive logic element 100 during a data sampling operation may be based on a logic table, such as Table 1. While Table 1 describes specific bit values for the DFT load signal 130, DFT unload signal 136, and emulation signal 126, any suitable bit values, signal states, and/or polarities may be used.

TABLE 1

| SIGNAL NAME | SIGNAL VALUE |
|---|---|
| DFT load signal 130 | 1 |
| DFT unload signal 136 | 0 |
| Emulation signal 126 | 1 |
| Fast Register Clock Signal | LAB clock signal 122 |
| Slow Register Clock Signal | DFT clock signal 124 |

Figure 5:
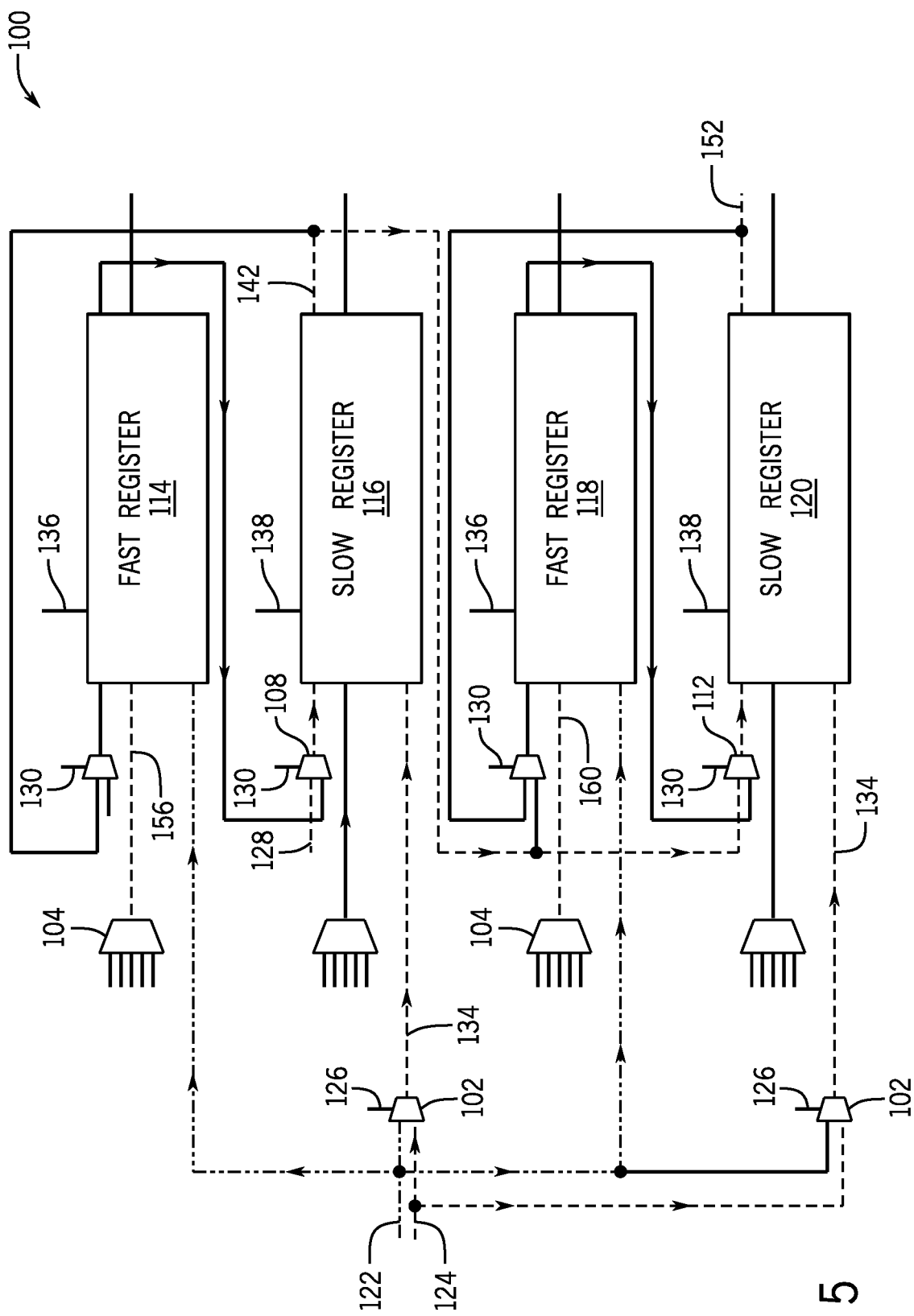
FIG. 5 is a block diagram of the adaptive logic element of FIG. 3 performing a shifting operation during emulation readback, in accordance with an embodiment of the present disclosure.

FIG. 5 is a block diagram of the adaptive logic element 100 of FIG. 3 performing a shifting operation during emulation readback, in accordance with an embodiment of the present disclosure. The multiplexers 102 may select the DFT clock signal 124 as output 134 and the slow registers 116, 120 may receive the DFT clock signal 124. The fast registers 114, 118 may include a multiplexer that receives DFT unload signal 136 and selects user data input signal 156, 160, respectively as output from the multiplexer. The multiplexer 108 may receive the DFT load signal 130 and select the test data output signal 128 from another slow register as data input signal for the slow register 116. As such, the adaptive logic element 100 may shift data from another slow register to slow register 116. The multiplexer 112 may select the test data output signal 142 from the slow register 116 and the slow register 120 may receive the test data output signal 142 as a test data input signal. Data previously stored in the slow register 120 may be shifted out as output signal 152. As such, the adaptive logic element 100 may shift data from slow register 116 to slow register 120 and data from slow register 120 may be shifted out as output signal 152. The control and clock signals supplied to the registers of the adaptive logic element 100 may be based on a logic table, such as Table 2. While Table 2 describes specific bit values for the DFT load signal 130, DFT unload signal 136, and emulation signal 126, any suitable bit values, signal states, and/or polarities may be used.

TABLE 2

| SIGNAL NAME | SIGNAL VALUE |
|---|---|
| DFT load signal 130 | 0 |
| DFT unload signal 136 | 0 |
| Emulation signal 126 | 1 |
| Fast Register Clock Signal | LAB clock signal 122 |
| Slow Register Clock Signal | DFT clock signal 124 |

Figure 6:
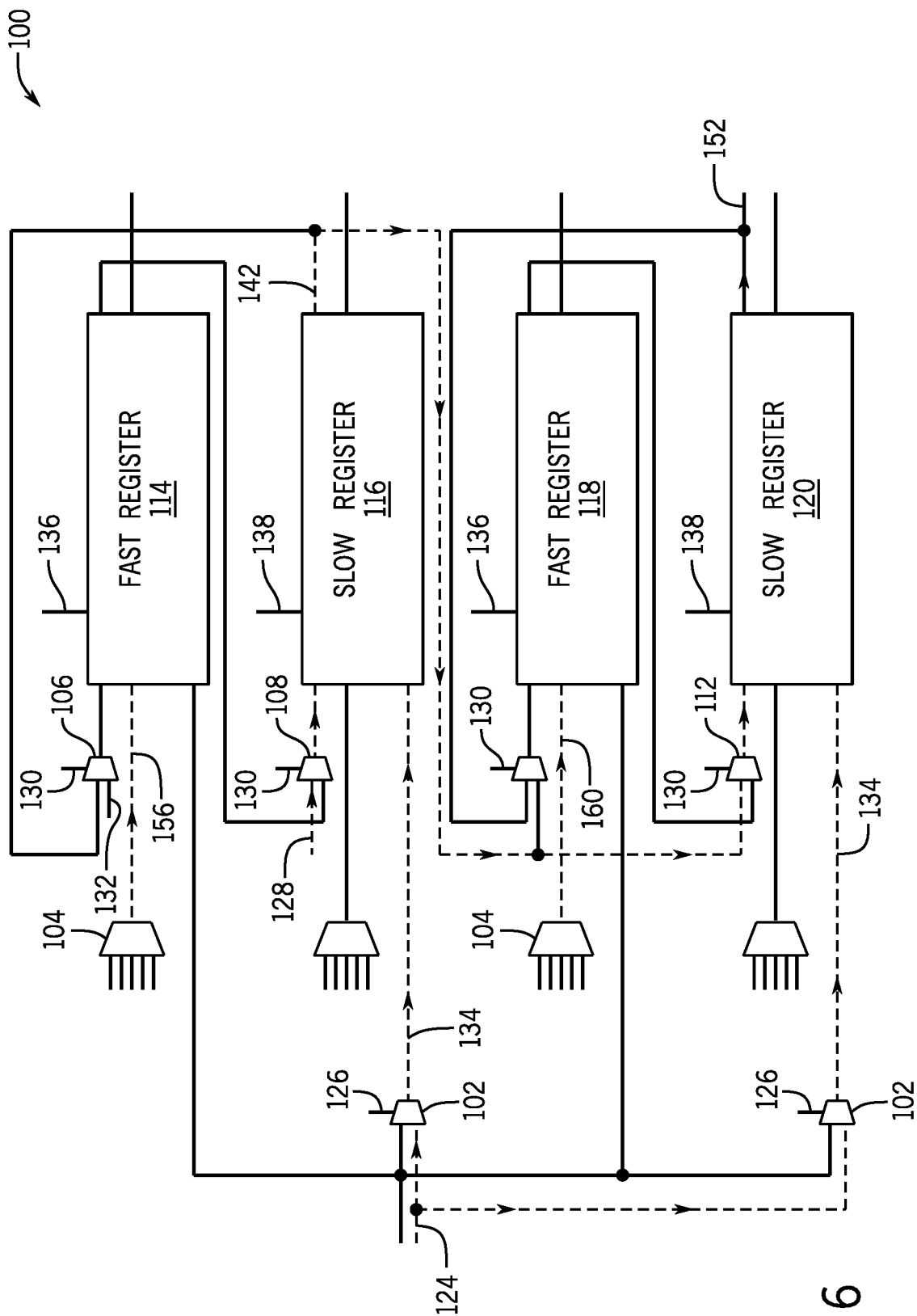
FIG. 6 is a block diagram of the adaptive logic element of FIG. 3 performing a shifting operation during emulation writeback, in accordance with an embodiment of the present disclosure.

FIG. 6 is a block diagram of the adaptive logic element of FIG. 3 performing a shifting operation during emulation writeback, in accordance with an embodiment of the present disclosure. The multiplexers 102 may select the DFT clock signal 124 as output 134 and the slow registers 116, 120 may receive the DFT clock signal 124. The fast registers 114, 118 may include a multiplexer that receives DFT unload signal 136 and selects user data input signal 156, 160, respectively as output from the multiplexer. The multiplexer 108 may receive the DFT load signal 130 and select the test output data signal 128 from another slow register as data input signal for the slow register 116. As such, the adaptive logic element 100 may shift data from another slow register to slow register 116. The multiplexer 112 may select the test data output signal 142 from the slow register 116 and the slow register 120 may receive the test data output signal 142 as a test data input signal. Data previously stored in the slow register 120 may be shifted out as output signal 152. As such, the adaptive logic element 100 may shift data from slow register 116 to slow register 120 and data from slow register 120 may be shifted out as output signal 152. As a result of the shifting operations in FIGS. 5 and 6, data previously stored in slow registers 116, 118 may be shifted out. The control and clock signals supplied to the registers of the adaptive logic element 100 may be based on a logic table, such as Table 3. While Table 3 describes specific bit values for the DFT load signal 130, DFT unload signal 136, and emulation signal 126, any suitable bit values, signal states, and/or polarities may be used.

TABLE 3

| SIGNAL NAME | SIGNAL VALUE |
| --- | --- |
| DFT load signal 130 | 0 |
| DFT unload signal 136 | 0 |
| Emulation signal 126 | 1 |
| Fast Register Clock Signal | LAB clock signal 122 |
| Slow Register Clock Signal | DFT clock signal 124 |

Figure 7:
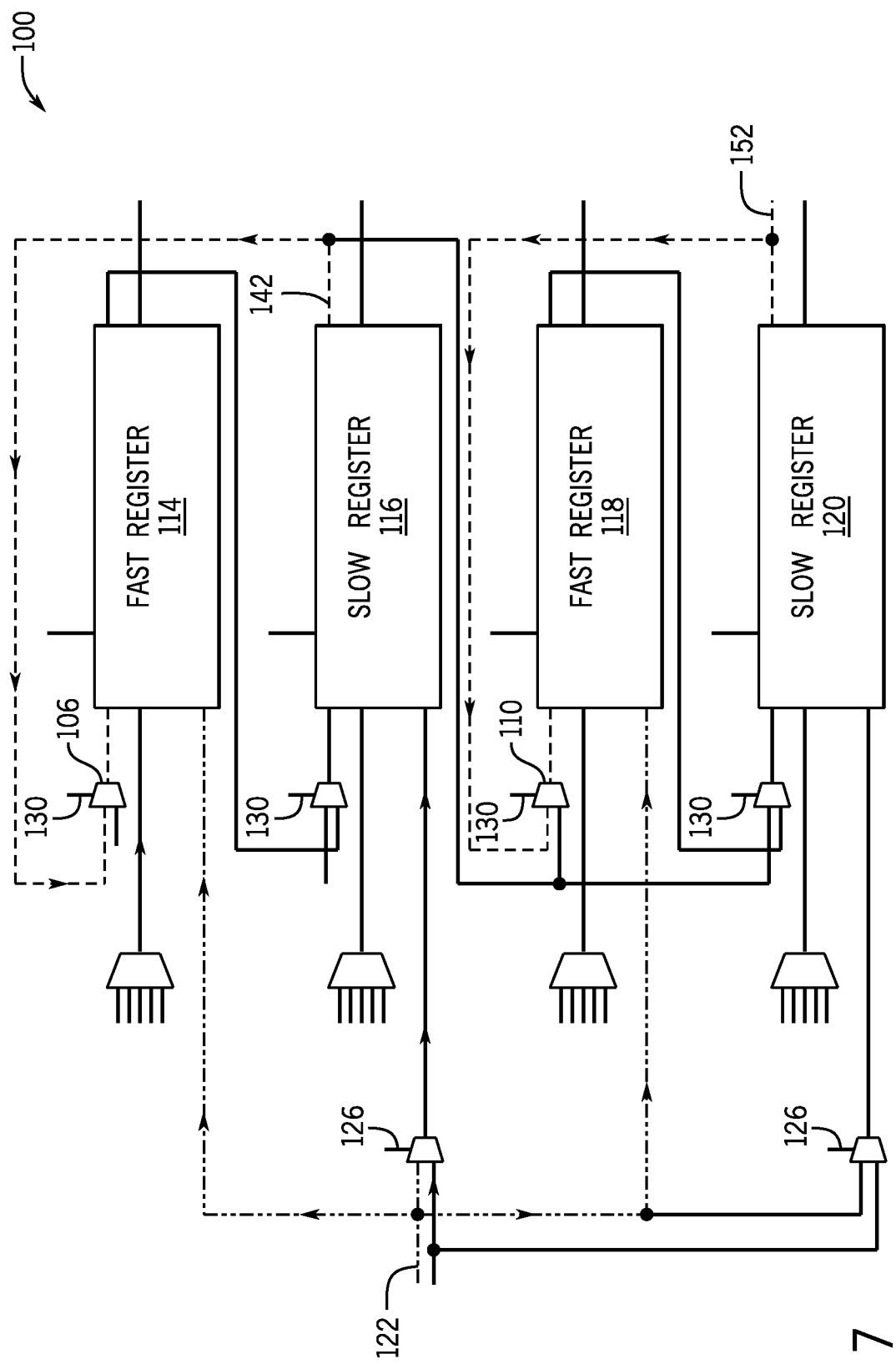
FIG. 7 is a block diagram of the adaptive logic element of FIG. 3 performing a writing operation during emulation writeback, in accordance with an embodiment of the present disclosure.

FIG. 7 is a block diagram of the adaptive logic element of FIG. 3 performing a writing operation during emulation writeback, in accordance with an embodiment of the present disclosure. The fast registers 114, 118 may receive the LAB clock signal 122 as a clock source. The multiplexer 106 may receive DFT load signal 130 and the multiplexer 106 may select test data output signal 142 from the slow register 116 as test data input for the fast register 114. As such, data stored in the slow register 116 may be output as test data output signal 142 and the adaptive logic element 100 writes the data to the fast register 114. The multiplexer 110 may receive DFT load signal 130 and the multiplexer 110 may select test data output signal 152 from the slow register 120 as test data input for the fast register 118. As such, data stored in the slow register 120 may be output as test data output signal 152 and the adaptive logic element 100 writes the data to the fast register 118. The control and clock signals supplied to the registers of the adaptive logic element 100 during a writing operation may be based on a logic table, such as Table 4. While Table 4 describes specific bit values for the DFT load signal 130, DFT unload signal 136, and emulation signal 126, any suitable bit values, signal states, and/or polarities may be used.

TABLE 4

| SIGNAL NAME | SIGNAL VALUE |
| --- | --- |
| DFT load signal 130 | 0 |
| DFT unload signal 136 | 1 |
| Emulation signal 126 | 1 |
| Fast Register Clock Signal | LAB clock signal 122 |
| Slow Register Clock Signal | DFT clock signal 124 |

Figure 8:
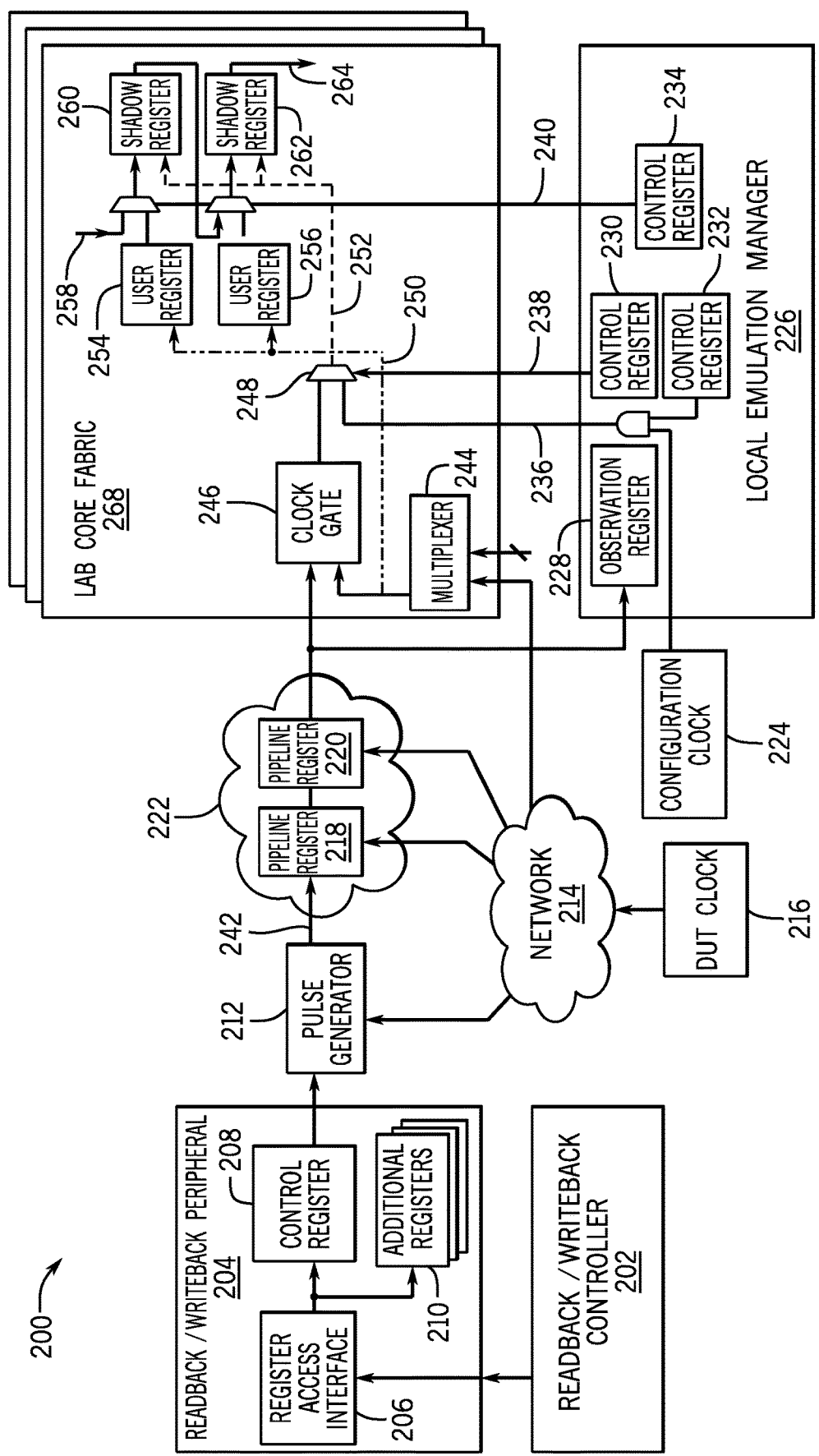
FIG. 8 is a block diagram of a system for ASIC emulation on an FPGA device, in accordance with an embodiment of the present disclosure.

FIG. 8 is a block diagram of a system 200 for ASIC emulation on an FPGA device, in accordance with an embodiment of the present disclosure. The system 200 may include readback/writeback peripheral 204 including register access interface 206, control register 208, and any number of additional registers 210. The readback/writeback peripheral 204 may be communicatively coupled to readback/writeback controller 202. For example, the readback/writeback controller 202 may communicate with control register 208 via register access interface 206. The system 200 may also include pulse generator 212 and pulse generator 212 may generate single wave pulses. The pulse generator 212 may be communicatively coupled to the readback/writeback peripheral 204 via the control register 208. In some embodiments, the system 200 may include pipeline registers 218, 220 in core fabric 222. The pipeline registers 218, 220 may receive single wave pulses from the pulse generator 212 and may ensure sample request pulse 242 and DUT clock signal 250 generated by the DUT clock 216 have the same frequency. In some embodiments, the DUT clock signal 250 generated by the DUT clock 216 may have a frequency of up to six hundred MHz (e.g., up to one hundred MHz, up to two hundred MHz, up to three hundred MHz, and so forth). The DUT clock 216 may be communicative coupled to the pulse generator 212 and the core fabric 222 via clock distribution network 214. The logic array block core fabric 268 may include multiplexer 244, clock gate 246, multiplexer 248, first user register 254, second user register 256, first shadow register 260, and second shadow register 262. Multiplexer 244 may provide DUT clock signal to the first user register 254 and the second user register 256. Local emulation manager 226 may include observation register 228 and first control register 230, second control register 232, and third control register 234. First control register 230 may generate a clock override signal 238 and third control register 234 may generate a shift/load signal 240. Configuration clock 224 may generate the emulation clock signal 236.

The readback/writeback controller 202 may communicate with the control register 208 via the register access interface 206. The readback/writeback controller 202 may set a sample request bit in the control register 208 to 1. The pulse generator 212 may detect a rising edge of the sample request bit and may generate a sample request pulse 242. The sample request pulse 242 may be synchronous with the DUT clock 216. Additionally, the sample request pulse 242 may be high for one cycle. The clock gate 246 may receive the sample request pulse 242 and may generate a single DUT clock 216 pulse that multiplexer 248 may receive as input. As such, the shadow registers 260, 262 may receive the single DUT clock 216 pulse as output 252 from multiplexer 248 and the shadow registers 260, 262 may sample data from user registers 254, 256, respectively and the shadow registers 260, 262 may operate at the same frequency as the user registers 254, 256. In certain embodiments, the shadow registers 260, 262 may operate at a frequency equal to or less than a frequency of the user registers 254, 256.

Local emulation manager 226 may receive sample request pulse 242, such as at observation register 228. In response, local emulation manager 226 may generate clock override signal 238 via control register 230. The multiplexer 248 may receive the clock override signal 238 and may select emulation clock 236 as output 252. Additionally, the local emulation manager 226 may generate shift/load signal 240 via control register 234 and the shadow registers 260, 262 may receive the shift/load signal 240. As such, the shadow registers 260, 262 may be configured into shift register mode and data stored in shadow register 262 may be shifted out as output 264. The data stored in shadow register 260 may be shifted to shadow register 262 on a first pulse of the shadow register clock 252 and may be shifted out of shadow register 262 on a subsequent pulse of the shadow register clock 252.

Figure 9:
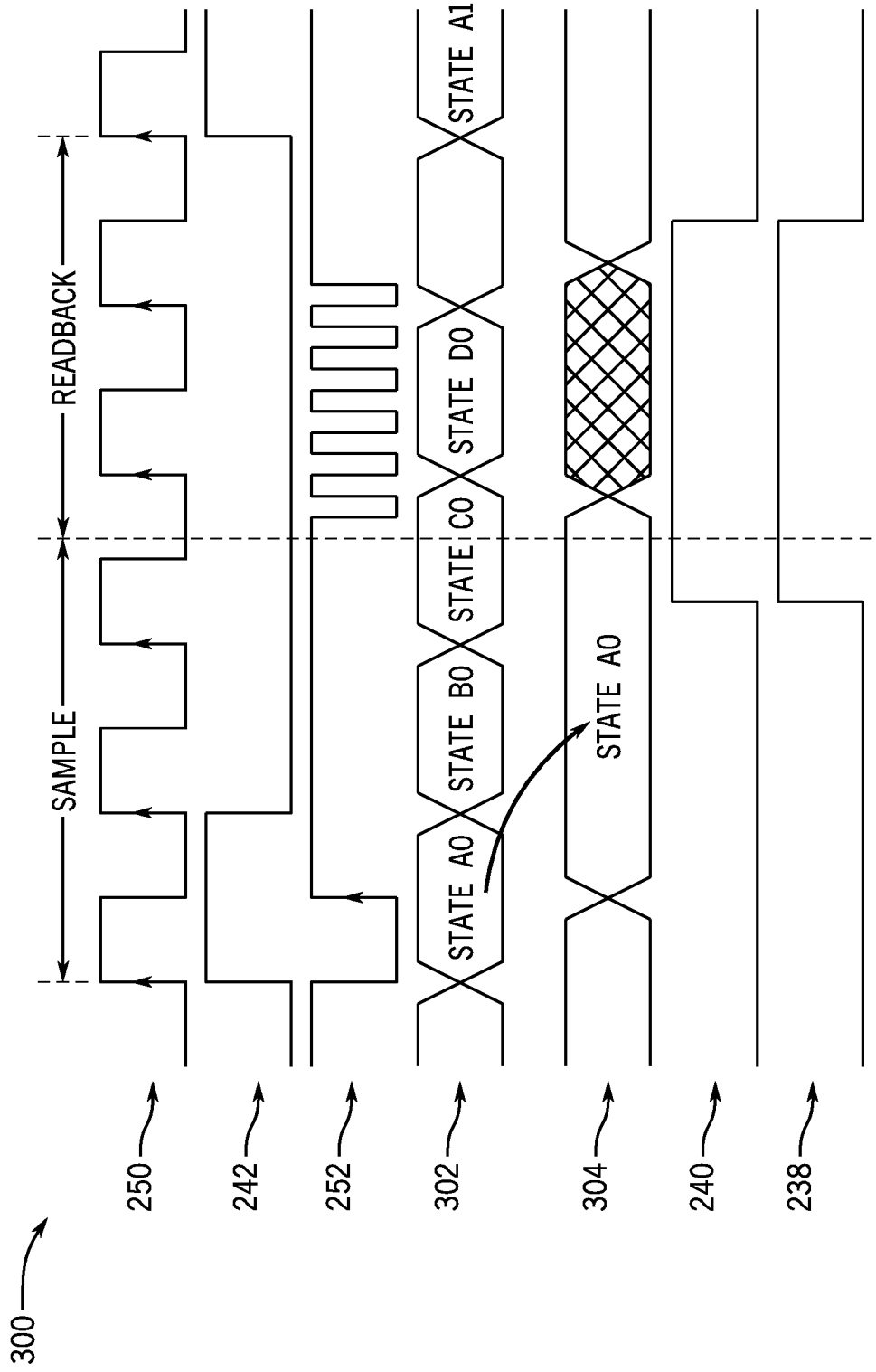
FIG. 9 is a timing diagram of the system of FIG. 8, in accordance with an embodiment of the present disclosure.

FIG. 9 is a timing diagram 300 of the system of FIG. 8, in accordance with an embodiment of the present disclosure. Timing diagram 300 includes waveforms 302, 304. Waveform 302 depicts a state of a user register, such as user register 254 and waveform 304 depicts a state of a shadow register, such as shadow register 260. As shown in timing diagram 300, the shadow register may sample a state of the user register. For example, the sample request pulse 242 may be received by clock gate 246 and the clock gate 246 may generate a single pulse that multiplexer 248 may receive and provide as output 252. The shadow register may sample the data, State AO, of the user register at the rising edge of the single pulse of the output 252. The local emulation manager 226 may generate the clock override signal 238. The shadow register may then receive shift/load signal 240 and the shift/load signal 240 may configure the shadow register into the shift register mode. As such, the shadow register may shift out the data stored in the shadow register.

Figure 10:
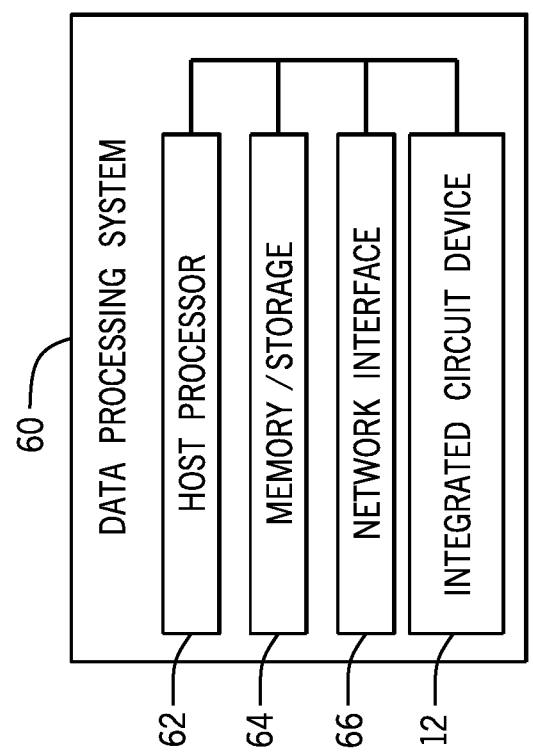
FIG. 10 is a data processing system, in accordance with an embodiment of the present disclosure.

The integrated circuit device 12 may be a data processing system or a component included in a data processing system. For example, the integrated circuit device 12 may be a component of a data processing system 60 shown in FIG. 10. The data processing system 60 may include a host processor 62 (e.g., a central-processing unit (CPU)), memory and/or storage circuitry 64, and a network interface 66. The data processing system 60 may include more or fewer components (e.g., electronic display, user interface structures, application specific integrated circuits (ASICs)). The host processor 62 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 60 (e.g., to perform debugging, data analysis, encryption, decryption, machine learning, video processing, voice recognition, image recognition, data compression, database search ranking, bioinformatics, network security pattern identification, spatial navigation, or the like). The memory and/or storage circuitry 64 may include random access memory (RAM), read-only memory (ROM), one or more hard drives, flash memory, or the like. The memory and/or storage circuitry 64 may hold data to be processed by the data processing system 60. In some cases, the memory and/or storage circuitry 64 may also store configuration programs (bitstreams) for programming the integrated circuit device 12. The network interface 66 may allow the data processing system 60 to communicate with other electronic devices. The data processing system 60 may include several different packages or may be contained within a single package on a single package substrate.

In one example, the data processing system 60 may be part of a data center that processes a variety of different requests. For instance, the data processing system 60 may receive a data processing request via the network interface 66 to perform ASIC emulation, debugging, error detection, data analysis, encryption, decryption, machine learning, video processing, voice recognition, image recognition, data compression, database search ranking, bioinformatics, network security pattern identification, spatial navigation, digital signal processing, or some other specialized task.

Accordingly, the techniques described herein enable ASIC emulation on a programmable logic device, such as an FPGA. For example, circuit design and signal data collection for a circuit to be implemented on an FPGA, such as integrated circuit 12, enables ASIC emulation and enhances the ability of integrated circuit devices, such as programmable logic devices (e.g., FPGAs), to be utilized for ASIC emulation applications while still being suitable for digital signal processing applications.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS OF THE DISCLOSURE

The following numbered clauses define certain example embodiments of the present disclosure.

EXAMPLE EMBODIMENT 1. A method, comprising:
providing a first clock signal having a first frequency from a first clock and a second clock signal having a second frequency from a second clock on an adaptive logic element, wherein the first clock signal is provided as a first clock source for a first register;
selecting, at a multiplexer, the second clock signal as a second clock source for a second register;
based on selecting the second clock signal as the second clock source:
sampling first data from the first register; and
storing the first sampled data on the second register, wherein the second frequency is equal to or lower than the first frequency.

EXAMPLE EMBODIMENT 2. The method of example embodiment 1, comprising selecting, at a second multiplexer, the first sampled data from the first register as data input for the second register.

EXAMPLE EMBODIMENT 3. The method of example embodiment 1, comprising:
providing the first clock signal as a third clock source for a third register; and
selecting, at a third multiplexer, the second clock signal as a fourth clock source for a fourth register.

EXAMPLE EMBODIMENT 4. The method of example embodiment 3, comprising: based on selecting the second clock signal as the fourth clock source:
sampling second data from the third register; and
storing the second sampled data on the fourth register.

EXAMPLE EMBODIMENT 5. The method of example embodiment 4, wherein the first frequency is up to six hundred MHz.

EXAMPLE EMBODIMENT 6. The method of example embodiment 1, wherein the second register is a shadow register.

EXAMPLE EMBODIMENT 7. The method of example embodiment 4, comprising shifting the stored second sampled data out of the fourth register.

EXAMPLE EMBODIMENT 8. The method of example embodiment 4, comprising shifting the stored first sampled data from the second register to the fourth register.

EXAMPLE EMBODIMENT 9. The method of example embodiment 8, comprising shifting the first sampled data out of the fourth register.

EXAMPLE EMBODIMENT 10. An adaptive logic element, comprising:
a first register pair, comprising:
a first register configurable to operate at a first frequency; and
a second register configurable to:
operate at a second frequency, wherein the second frequency is equal to or lower than the first frequency; and
store data from the first register;
a first clock configurable to provide a first clock signal to the first register;
a second clock configurable to provide a second clock signal; and
a multiplexer configurable to select the first clock signal or the second clock signal as a clock source for the second register.

EXAMPLE EMBODIMENT 11. The adaptive logic element of example embodiment 10, comprising:
a second register pair, comprising:
a third register configurable to operate at the first frequency; and
a fourth register configurable to operate at the second frequency, wherein the fourth register is configurable to store data from the third register.

EXAMPLE EMBODIMENT 12. The adaptive logic element of example embodiment 11, comprising a second multiplexer configurable to select the first clock signal or the second clock signal as a second clock source for the fourth register.

EXAMPLE EMBODIMENT 13. The adaptive logic element of example embodiment 11, wherein the first clock is configurable to provide the first clock signal to the third register.

EXAMPLE EMBODIMENT 14. The adaptive logic element of example embodiment 12, wherein the second multiplexer selects the second clock signal to store data from the third register on the fourth register.

EXAMPLE EMBODIMENT 15. The adaptive logic element of example embodiment 10, wherein the multiplexer selects the second clock signal to store data from the first register on the second register.

EXAMPLE EMBODIMENT 16. The adaptive logic element of example embodiment 10, comprising a third multiplexer configurable to select the data from the first register as input data for the second register.

EXAMPLE EMBODIMENT 17. A system, comprising:
a first register pair, comprising:
a first register configurable to operate at a first frequency; and
a second register configurable to:
operate at a second frequency, wherein the second frequency is equal to or lower than the first frequency; and
store data from the first register;
a second register pair, comprising:
a third register configurable to operate at the first frequency; and
a fourth register configurable to operate at the second frequency, wherein the fourth register is configurable to store data from the third register, and wherein the fourth register is configurable to store data shifted out from the second register.

EXAMPLE EMBODIMENT 18. The system of example embodiment 17, comprising a first multiplexer configurable to select a first clock signal at the first frequency or a second clock signal at the second frequency as a clock source for the second register.

EXAMPLE EMBODIMENT 19. The system of example embodiment 18, comprising a second multiplexer configurable to select the first clock signal or the second clock signal as a second clock source for the fourth register.

EXAMPLE EMBODIMENT 20. The system of example embodiment 18, wherein the second multiplexer selects the second clock signal to shift stored data from the second register to the fourth register.

What is claimed is:

1. A method, comprising:
providing a first clock signal having a first frequency from a first clock and a second clock signal having a second frequency from a second clock on an adaptive logic element, wherein the first clock signal is provided as a first clock source for a first register;
selecting, at a multiplexer, the second clock signal as a second clock source for a second register by selecting between the first clock and the second clock for the second register by outputting the second clock signal from the multiplexer to the second register;
based on selecting the second clock signal as the second clock source:
sampling first data from the first register; and
storing the first sampled data on the second register, wherein the second frequency is equal to or lower than the first frequency.

2. The method of claim 1, comprising selecting, at a second multiplexer, the first sampled data from the first register as data input for the second register.

3. The method of claim 1, comprising:
providing the first clock signal as a third clock source for a third register; and
selecting, at a third multiplexer, the second clock signal as a fourth clock source for a fourth register.

4. The method of claim 3, comprising:
based on selecting the second clock signal as the fourth clock source:
sampling second data from the third register; and
storing the second sampled data on the fourth register.

5. The method of claim 4, wherein the first frequency is up to six hundred MHz.

6. The method of claim 1, wherein the second register is a shadow register.

7. The method of claim 4, comprising shifting the stored second sampled data out of the fourth register.

8. The method of claim 4, comprising shifting the stored first sampled data from the second register to the fourth register.

9. The method of claim 8, comprising shifting the stored first sampled data out of the fourth register.

10. An adaptive logic element, comprising:
a first register pair, comprising:
a first register configurable to operate at a first frequency; and
a second register configurable to:
operate at the first frequency or at a second frequency, wherein the second frequency is lower than the first frequency; and
store data from the first register;
a first clock configurable to provide a first clock signal to the first register at the first frequency;
a second clock configurable to provide a second clock signal at the second frequency; and a multiplexer configurable to select between the first clock signal and the second clock signal as a clock source for the second register and to transmit the clock source for the second register to the second register.

11. The adaptive logic element of claim 10, comprising:

a second register pair, comprising:
  a third register configurable to operate at the first frequency; and
  a fourth register configurable to operate at the second frequency, wherein the fourth register is configurable to store data from the third register.

12. The adaptive logic element of claim 11, comprising a second multiplexer configurable to select the first clock signal or the second clock signal as a second clock source for the fourth register.

13. The adaptive logic element of claim 11, wherein the first clock is configurable to provide the first clock signal to the third register.

14. The adaptive logic element of claim 12, wherein the second multiplexer selects the second clock signal to store data from the third register on the fourth register.

15. The adaptive logic element of claim 10, wherein the multiplexer selects the second clock signal to store data from the first register on the second register.

16. The adaptive logic element of claim 10, comprising a third multiplexer configurable to select the data from the first register as input data for the second register.

17. A system, comprising:
a first register pair, comprising:
  a first register configurable to operate at a first frequency; and
  a second register configurable to:
    operate at the first frequency or at a second frequency, wherein the second frequency is lower than the first frequency; and
    store data from the first register;
a second register pair, comprising:
  a third register configurable to operate at the first frequency;
  a fourth register configurable to operate at the first frequency or the second frequency, wherein the fourth register is configurable to store data from the third register, and wherein the fourth register is configurable to store data shifted out from the second register;
a first multiplexer configurable to select between a first clock signal at the first frequency and a second clock signal at the second frequency as a clock source for the second register and to transmit the clock source for the second register to the second register; and
a second multiplexer configurable to select the first clock signal or the second clock signal as a second clock source for the fourth register and to transmit the second clock source for the fourth register to the fourth register.

18. The system of claim 17, wherein the second multiplexer selects the second clock signal to shift stored data from the second register to the fourth register.

* * * * *